(12) United States Patent
Geva et al.

(10) Patent No.: US 6,437,372 B1
(45) Date of Patent: Aug. 20, 2002

(54) DIFFUSION BARRIER SPIKES FOR III-V STRUCTURES

(75) Inventors: Michael Geva, Allentown; Jayatirtha N Holavanahalli, Macungie; Abdallah Ougazzaden, Emmaus; Lawrence Edwin Smith, Macungie, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/540,474

(22) Filed: Mar. 31, 2000

Related U.S. Application Data

(60) Provisional application No. 60/175,009, filed on Jan. 7, 2000, and provisional application No. 60/175,000, filed on Jan. 7, 2000.

(51) Int. Cl.$^7$ .......................... H01L 33/00; H01L 23/053
(52) U.S. Cl. .......................... 257/94; 257/95; 257/102; 257/103; 257/200; 257/740; 372/45; 372/46; 438/48
(58) Field of Search .......................... 257/740, 743, 257/200, 102, 103, 458, 94, 466, 95; 372/45, 46, 48; 438/48

(56) References Cited

U.S. PATENT DOCUMENTS

| | | | |
|---|---|---|---|
| RE30,782 E | | 10/1981 | Van Turnhout |
| 4,371,967 A | | 2/1983 | Wada et al. |
| 4,479,222 A | | 10/1984 | Hawrylo |
| 4,589,892 A | | 5/1986 | Leonard |
| 4,817,942 A | | 4/1989 | Begon |
| 5,212,705 A | * | 5/1993 | Kahen et al. .................. 372/46 |
| 5,230,800 A | | 7/1993 | Nelson |
| 5,265,348 A | | 11/1993 | Fleishman et al. |
| 5,332,426 A | | 7/1994 | Tang et al. |
| 5,341,006 A | | 8/1994 | Hirose |
| 5,393,676 A | | 2/1995 | Anjum et al. |
| 5,633,177 A | | 5/1997 | Anjum |
| 5,683,478 A | | 11/1997 | Anonychuk |
| 5,825,047 A | * | 10/1998 | Ajisawa et al. ................ 257/12 |
| 5,879,230 A | | 3/1999 | Wardlaw et al. |
| 6,004,365 A | | 12/1999 | Fiacco |
| 6,099,608 A | | 8/2000 | Harms et al. |
| 6,099,609 A | | 8/2000 | Lira et al. |

FOREIGN PATENT DOCUMENTS

| | | |
|---|---|---|
| DE | 2219846 | 10/1973 |
| EP | 1 024 566 A2 | 8/2000 |
| FR | 1500667 | 1/1968 |
| JP | 3038068 | 2/1991 |
| JP | 4199881 | 7/1992 |
| JP | 7131105 | 10/1993 |
| JP | 605895 A * | 1/1994 |
| JP | 7245447 | 9/1995 |
| JP | 11074624 | 7/1997 |
| JP | 110068150 | 9/1997 |
| WO | WO 97/50133 | 12/1997 |

* cited by examiner

*Primary Examiner*—Tom Thomas
*Assistant Examiner*—Donghee Kang

(57) ABSTRACT

A diffusion preventing barrier spike is disclosed. The spike prevents diffusion of dopants into another layer without forming a pn junction in the layer. The spikes are illustratively Al or an aluminum containing material such as AlAs and have a thickness on the order of 1 nm. The spikes of the present invention may be used to stop dopant diffusion out of a doped layer in a variety of III-V semiconductor structures, such a InP-based PIN devices.

8 Claims, 1 Drawing Sheet

DIFFUSION BARRIER SPIKES FOR III-V STRUCTURES

CROSS-REFERENCE TO RELATED APPLICATION

The present application claims priority from U.S. Provisional Patent Application Ser. No: 60/175,009 filed Jan. 7, 2000 and 60/175000 filed Jan. 7, 2000. The present application is also related to U.S. patent application Ser. No. 09/539,882 09/540,471 filed on even date herewith and assigned to the assignee of the present invention. The disclosures of the above captioned patent and provisional patent applications are specifically incorporated herein by reference.

FIELD OF THE INVENTION

The present invention relates to a dopant diffusion barrier spike for use in III-V semiconductor structures.

BACKGROUND OF THE INVENTION

The precise placement of p n and pi (p type-intrinsic) junctions in the active regions and blocking structures of optoelectronic devices is exceedingly important for meeting the increasingly stringent requirements placed on device performance, such as modulation bandwidth, output power, extinction ratio and uncooled operation.

One typical structure employed in optoelectronic devices is the p-i-n (PIN) structure. In a typical PIN structure, an intrinsic layer is disposed between a p-type layer and a n-type layer. Typically, heterojunctions are formed at the p-i and n-i interfaces. The intrinsic layer has a larger index of refraction than the p and n layers resulting in a natural waveguide. Furthermore, the energy band discontinuities in the conduction and valence bands in the PIN structure facilitate carrier confinement within the active layer. In short the PIN structure is well suited for variety of photoemitter and photodetector optoelectronic device applications.

One material that is often used in optoelectronics devices is indium phosphide (InP). In a PIN structure employing InP, a p-type InP (p-InP) layer is often fabricated by introducing zinc as a dopant. While zinc is a suitable dopant for forming a p-type layer, zinc can readily diffuse during the higher temperatures achieved in the growth of InP. Diffusion into the active (intrinsic layer in a PIN structure) layer can occur resulting in the undesired doping of the active layer. This can have deleterious effects. For example, in a laser, intra-band transitions can occur resulting in optical losses and reduced output power. Furthermore, the unintentional doping of the active layer can result in a shift in the emitted wavelength of an emitter. In applications where the PIN structure is used as an electroabsorptive modulator, zinc dopants in the active layer can change the absorption edge thereby degrading the extinction ratio.

In order to overcome the drawbacks of diffusion of zinc dopants into the active region, diffusion barriers or blocks have been employed. These diffusion barrier layers prevent zinc diffusion into the active layer, thereby overcoming the drawbacks discussed above. A very thin layer of silicon, for example, can be placed in the p-InP layer creating a good diffusion barrier layer. However, because silicon is a donor material, an undesired p-n junction can be formed in the p-InP layer. While preventing the diffusion of zinc dopants into the active layer, the formation of the p-n junction introduces an undesired parasitic capacitance which is particularly undesirable in high speed devices. The resulting p-n junction is parasitic and may result in carrier recombination. In a laser, for example, a higher drive current may be required. As would be readily appreciated by one of ordinary skill in the art, a higher drive current results in overheating of the device and, consequently, a wavelength shift of the emitted light.

Another technique used to prevent zinc dopant from diffusing into the active layer is the use of an undoped layer on InP, also referred to a set-back layer. While the InP set-back layer is somewhat successful in preventing the diffusion of zinc dopants into the active layer, the optimal thickness of the set-back layer is dependent upon the 3 doping level and thickness of the zinc doped cladding and contact layers. This creates undesired fabrication complexities. Moreover, the zinc doping profile is difficult to using a set-back layer. For. example, near the active region the p-type doping concentration and the p-InP layer can be low. In a laser, for example, this reduces carrier concentration resulting in reduced power and ultimately in reduced efficiency of the laser. To supply suitable output power, the drive current will be increased, resulting in heating problems to include heating induced wavelength shift.

Accordingly, what is needed is a technique for blocking the diffusion of zinc dopants from the p-InP layer of a optoelectronic device which overcomes the drawbacks of the techniques discussed above.

SUMMARY OF THE INVENTION

The present invention relates to an optoelectronic device having at least one dopant diffusion barrier spike disposed in a doped layer of the device. The dopant diffusion barrier spike material is chosen so that it will not create a pn junction within the doped layer, but will effectively prevent diffusion.

BRIEF DESCRIPTION OF THE DRAWING

The invention is best understood from the following detailed description when read with the accompanying drawing figures. It is emphasized that in accordance with the standard practice in the semiconductor industry the various features are not drawn to scale. In fact, the dimensions of the various features may be arbitrarily increased or reduced for clarity of discussion.

DETAILED DESCRIPTION OF THE INVENTION

Figure 1:
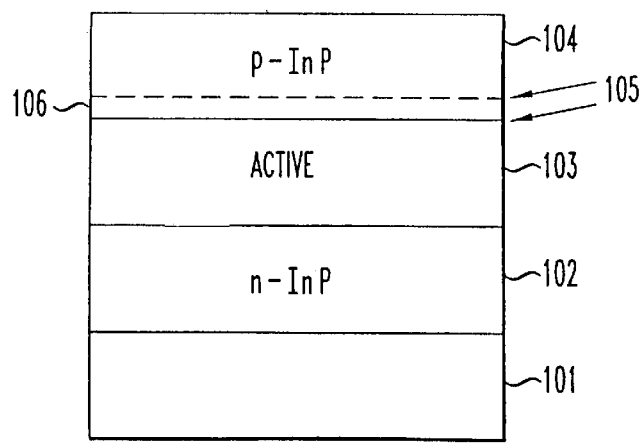
FIG. 1 is a cross-sectional view of an exemplary embodiment of the present invention showing a diffusion barrier spike.

Briefly, the present invention relates to a dopant diffusion barrier spike for use in III-V semiconductor structures. In an exemplary embodiment shown in FIG. 1, a substrate 101 has disposed thereover an n-type layer 102, an active layer 103, and a p-type layer 104. A dopant diffusion barrier spike 105 is disposed over an undoped layer 106. Herein, the term dopant diffusion barrier spike refers generally to a very thin layer of material chosen to prevent the diffusion of p-type dopants from layer 104 into the active region, while not creating parasitic p-n junctions. To this end, the spike 105 prevents the contamination of the intrinsic layer on 103 by the p-type dopants from the cladding layer 104 without the formation of the parasitic p-n junctions in the in layer 104. Accordingly, the spike 105 enables the use of a suitable dopant to create the p-i-n structure.

For purposes of illustration, the devices of the exemplary embodiments of the present invention may be a semiconductor laser or modulator. However, as will be readily appreciated by one of ordinary skill in art, the devices of the exemplary embodiments may be a variety of photoemitters or photodetectors. Furthermore, unless otherwise discussed, the techniques used to fabricate the structures of the illustrative embodiments are conventional semiconductor fabrication techniques. As these techniques are known to one of ordinary skill in the art, further details will be foregone.

The exemplary embodiment of FIG. 1 is a PIN device. The substrate 101 is InP, with a n-type InP layer 102 (also referenced as a lower cladding layer) disposed thereon. The active layer 103 is an intrinsic layer of InGaAsP, having a p-type InP layer 104 disposed thereover. Typically, the p-type dopant used in fabricating layer 104 is zinc, although dopants including Be, Mg or Cd may be used. Illustratively, the dopant barrier spike is aluminum or an aluminum-containing material such as AlAs. More particularly, in this illustrative embodiment, the aluminum spike 105 is a thin layer of aluminum, on the order of 1 nm in thickness.

The advantages of aluminum or aluminum containing materials are discussed presently. Aluminum provides the barrier to zinc diffusion from the p-type layer 104 into the active layer 103. However, aluminum will not act as a donor species in the InP layer 104. Accordingly, the spike 105 will not create a parasitic p-n junction, which results in undesired carrier recombination outside of the active region. Applicants further theorize without being bound that the interface between the spike 105 and the p-type layer 104 also helps reduce the diffusion of dopants from the layer 104 to the active layer. A significant drop off in the concentration of the dopant occurs at this interface. Additionally because the spike 105 is relatively thin (1 nm in the case of aluminum) it has advantages over thicker conventional diffusion blocking layers in addition to those discussed previously. For example, because the spike is very thin and because of the relatively wide bandgap of Al (>1.46 eV), the Al or Al-containing spikes do not add to the optical absorption of the device Thereby device absorption characteristics are virtually unaffected by the spike 105.

While Al or Al-containing materials are illustrative materials for use as the dopant diffusion barrier spikes of the present invention, clearly other materials may be used as the dopant diffusion barrier spike in keeping with the present invention. This may be particularly the case if other III-V semiconductor materials and dopants are used to fabricate the optoelectronic device. In any event, the dopant diffusion barrier spike of the present invention may be of a suitable material to block the diffusion of dopants into the active layer 104, while not creating a pn junction in the doped layer in which it is disposed.

Figure 2:
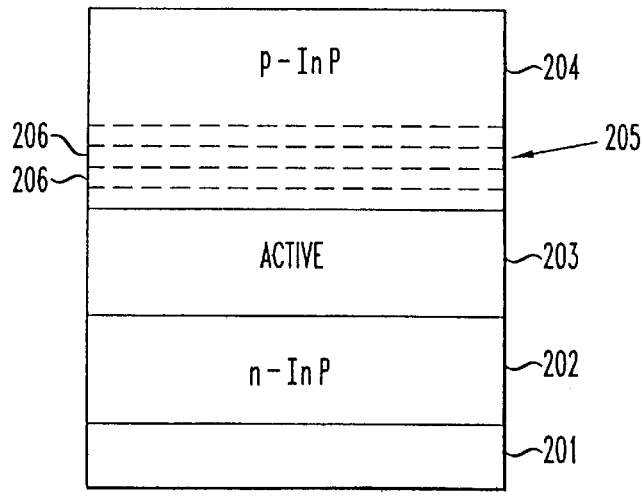
FIG. 2 is a cross-sectional view of an exemplary embodiment of the present invention showing multiple diffusion barrier spikes.

Turning now to FIG. 2, another embodiment of the present invention is shown. The basic structure and materials shown are the same as shown in FIG. 1. The substrate 201 has an n-type layer 202, an active layer 203, and a p-type layer 204 thereover. The spikes shown at 205 are separated by undoped InP layers 206 approximately 100–1000 Angstroms thick. The number of spikes depends on the level of zinc in the layer (or layers) on the other side of the barrier. For example, with a concentration of zinc dopants of $1.8 \times 10^{+18}$ cm$^{-3}$, an InP layer with on the order of six aluminum spikes, each on the order of 1 nm thick, with a layer of undoped InP of suitable thickness therebetween, provides an effective barrier for zinc diffusion. In this case, in addition to the ability of the spikes to block dopant diffusion, applicants again believe without wishing to be bound, that each interface between spikes 205 and layers 204 and 206 aids in blocking the diffusion of dopants. Further details of an exemplary fabrication sequence resulting in the structure shown in FIG. 2 are disclosed below.

Finally, while the embodiment shown in FIG. 2 is illustrative of the multiple spike structure for a particular doping level in layer 204, depending upon the doping concentration of the layer 204, the number of spikes, and therefore the number of interfaces between layers 206 and spikes 205, can vary.

Figure 3:
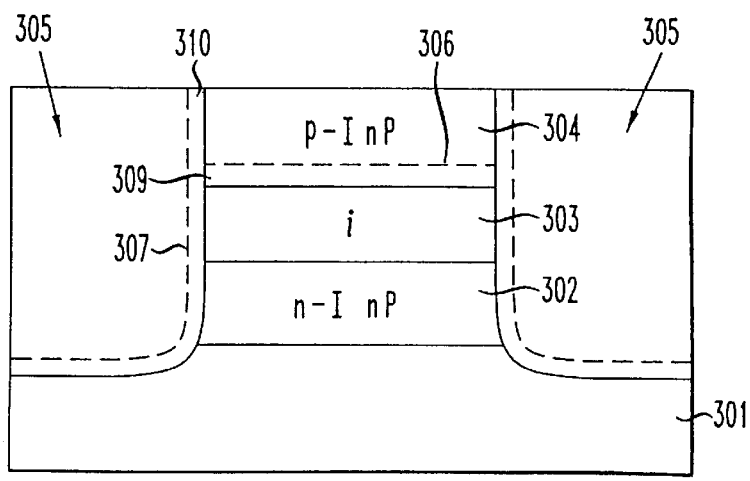
FIG. 3 is a cross-sectional view of a mesa structure having diffusion preventing barrier spikes within the p-type region as well as between the p-type region and the blocking layers.

Turning to FIG. 3, an illustrative embodiment of the invention employed in a mesa structure optoelectronic device is shown. As is known, many semiconductor light emitting devices such as lasers employ semi-insulating current confinement (also referred to as burying and lateral confinement) layers for optical and carrier confinement. Such a structure is often referred to as a buried heterostructure device. A substrate 301 has disposed thereon a lower cladding layer 302 which is illustratively n-doped InP. An intrinsic layer 303 of InGaAsP or other suitable ternary or quaternary III-V material, such as InP, is disposed on the layer 302 with a top cladding layer 304 of p-type InP thereon. Lateral confinement layers or burying layers 305 are illustratively iron (Fe) doped InP. Fe-doped InP which is both electrically highly resistive and has an index of refraction lower than that of the active layer 303, enables both current confinement and transverse optical confinement. Diffusion preventing barrier spikes of the present invention are shown at 306 and 307. The spikes shown at 306 are virtually identical to those described in connection with FIGS. 1 and 2 and serve to prevent diffusion of dopants from the upper cladding layer 304 into the intrinsic layer 303. The barrier 306 can be a single barrier spike as shown in FIG. 1 or multiple barrier spikes shown in FIG. 2.

The barrier spike shown generally at 307 also prevents dopant diffusion from the p-InP layer 304 into the burying layers 305 by the same mechanism as discussed in connection with FIG. 1. Additionally, the spikes 307 serve to block the diffusion of iron from the semi-insulating iron doped InP layer 305 into the mesa structure. This is clearly desirable, since the diffusion of iron into layers 302, 303, 304 tend to make these layers resistive, which is clearly not desirable. The spikes 307 serve to reduce leakage current from the layer 304 into the semi-insulating layer 305, which is clearly desired if current confinement is to be achieved. Moreover, because zinc is prevented from diffusing out of the p-type cladding layer 304 into the semi-insulating iron doped layer 305, the tendency of parasitic capacitance to form along the junction of the semi-insulating layer 305 and the p-type cladding layer 304 is reduced significantly.

Referring to FIG. 3, the process steps for fabricating an exemplary laser diode with a buried ridge incorporating the dopant diffusion barrier spike is discussed. Because the fabrication techniques discussed in connection with the exemplary laser of FIG. 3 may be applied to fabricate the structures shown in FIGS. 1 and 2, a detailed discussion of the fabrication of the structures shown in FIGS. 1 and 2 will be foregone in the interest of brevity. The fabrication of the buried ridge laser diode of FIG. 3 begins with the formation of n-InP layer 302 and the active region 303 by well known techniques. Above the active region, spikes 306

(illustratively Al or Al containing material such as AlAs) are fabricated. A layer of suitable cladding material, illustratively undoped InP, 309 is formed between the active layer 303 and the spike 306. This layer 309 may be fabricated by standard technique such as MOCVD, metal organic vapor phase epitaxy (MOVPE), molecular beam epitaxy (MBE) or liquid phase epitaxy (LPE), among others. The spike 306 is formed thereover, again by one of the above techniques used for forming the InP layer 309. In the exemplary embodiments of FIGS. 1–3, the spike may be Al or AlAs, for example, having a thickness on the order of 1 nm. If more than one spike were desired, for example in the structure in FIG. 2 (not shown in FIG. 3) successive layers of undoped InP would have spikes disposed thereon, again by the same techniques used to form layer 309 and spike 306.

After the last spike is deposited, a p-doped layer is formed. In the exemplary embodiments of FIGS. 1–3, this is p-doped InP. The layer 304 of p-doped InP is fabricated by conventional technique such as MOVPE, MOCVD and others discussed above. Suitable dopants are introduced during the formation of the InP layer 304. These include, but are not limited to Zn, Be, Cd or Mg.

Thereafter the mesa structure with current confinement layers 305 is formed. A conventional mask such as $SiO_2$ or $Si_3N_4$ is formed into a stripe on the upper surface of layer 304. Subsequently, the multi-layered structure 304,303,302 is selectively etched down to the n-InP substrate 301 to produce a mesa stripe, as illustrated in FIG. 3. The semi-insulating current blocking layers 305 are fabricated by standard technique, such as MOVPE, MOCVD and other techniques known in the art. The spikes 307 are formed from the materials discussed above in connection with the embodiments of FIGS. 1–3. Moreover, the spikes 307 could be single spikes (as shown in FIG. 3) or multiple spikes (not shown in FIG. 3). If multiple spikes are used, these would be separated by undoped material identical to layer 310, and formed by like technique. The spikes 307 are formed by the same technique used to fabricate the spikes 306. Again, layer 310 is a thin layer (100–1000 Angstroms) of undoped material, such as InP.

As stated, the present invention is applicable to a variety of optoelectronic devices. Illustrative devices include, but are not limited to, semiconductor lasers, modulators and detectors. As is known, in these devices heterojunctions are used. A wide variety of materials, to include III-V semiconductors may be used to fabricate the heterostructure device of the present invention. For example, materials that may be used to form the heterostructure from layers 102,103 and 104, include, but are not limited to, GaAs, GaP, InGaAsP, and InGaAs. The active layer may incorporate a single intrinsic or a single quantum well layer, depending on the ultimate device sought. Moreover, it is clear that multiple heterojunction structures such as superlattice structures, or multiquantum well (MQW) structures, may be used for the active layer. Materials to include those listed above, and others within the purview of one of ordinary skill in the art may be employed in this capacity. The particular materials chosen for layers 102, 103 and 104, as well as the chosen stochiometry varies depending on device application and desired characteristics. Such choices of materials and stoichiometry would be within the purview of one of ordinary skill in the art. Of course, in keeping with the discussion above, these various materials may use a variety of dopants. The material chosen for the spikes 105 as well as there number, orientation and the spacing of the spikes would be chosen according to the materials used for layers 102,103 and 104 and the dopants used therein.

The invention having been described in detail, is clear that modification and variations will be readily apparent to one of ordinary skill in the art having the benefit of having the present disclosure. To the extent that such modifications and variations for fabricating diffusion barrier spikes to prevent dopant diffusion in semiconductor devices while avoiding the deleterious effects of undesired p-n junctions are readily available to one of ordinary in the art, such are deemed in the scope of the present invention.

What is claimed:

1. An optoelectronic device, comprising:
   a mesa having first and second sides, wherein the mesa includes;
   a first layer; and
   an intrinsic layer disposed over said first layer; and
   a second layer disposed over said first layer;
   blocking layers disposed along said first and second sides of said mesa; and
   diffusion blocking spikes disposed between each of said first and second sides and said blocking layers, said spikes not creating a pn junction in said second layer.

2. An optoelectronic device as recited in claim 1, wherein said first layer is n-type InP, said second layer is p-type InP and said blocking layers are semi-insulating InP.

3. An optoelectronic device as recited in claim 1, wherein each of said diffusion blocking spikes disposed between each of said first and second sides are Al.

4. An optoelectronic device as recited in claim 1, wherein each of said diffusion blocking spikes disposed between each of said first and second sides contains aluminum.

5. The optoelectronic device as recited in claim 1 further including a second at least one dopant diffusion barrier spike disposed in said second layer, said second at least one at least one dopant diffusion barrier spike not creating a pn junction in said second layer.

6. An optoelectronic device as recited in claim 5, wherein said second at least one dopant diffusion barrier spike is Al.

7. An optoelectronic device as recited in claim 5, wherein said second at least one dopant diffusion barrier spike contains aluminum.

8. The optoelectronic device as recited in claim 1 wherein each of said diffusion blocking spikes disposed between each of said first and second sides have a thickness of 1 nm.

* * * * *